US012453162B2

(12) United States Patent
Umezawa et al.

(10) Patent No.: US 12,453,162 B2
(45) Date of Patent: Oct. 21, 2025

(54) SEMICONDUCTOR DEVICES AND METHODS OF MANUFACTURING THE SAME

(71) Applicant: Samsung Electronics Co., Ltd., Suwon-si (KR)

(72) Inventors: Naoto Umezawa, Seongnam-si (KR); Satoru Yamada, Yongin-si (KR); Junsoo Kim, Seongnam-si (KR); Honglae Park, Seongnam-si (KR); Chunhyung Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 17/702,856

(22) Filed: Mar. 24, 2022

(65) Prior Publication Data

US 2022/0223713 A1 Jul. 14, 2022

Related U.S. Application Data

(63) Continuation of application No. 16/927,463, filed on Jul. 13, 2020, now Pat. No. 11,329,137.

(30) Foreign Application Priority Data

Nov. 6, 2019 (KR) .......................... 10-2019-0141208

(51) Int. Cl.
*H10D 64/68* (2025.01)
*H01L 21/324* (2006.01)
(Continued)

(52) U.S. Cl.
CPC ......... *H10D 64/693* (2025.01); *H10B 12/315* (2023.02); *H10D 64/513* (2025.01); *H10D 64/661* (2025.01)

(58) Field of Classification Search
CPC .......................... H01L 29/518; H01L 29/4236
See application file for complete search history.

(56) References Cited

U.S. PATENT DOCUMENTS 6,355,519 B1 * 3/2002 Lee .................. H01L 21/02337
438/254
6,881,636 B2 4/2005 Weimer et al.
(Continued)

FOREIGN PATENT DOCUMENTS

CN 1849704 A 10/2006
KR 100312017 B1 11/2001
(Continued)

OTHER PUBLICATIONS

Kizilyalli et al, Deuterium Post-Metal Annealing of MOSFET's for Improved Hot Carrier Reliability, Mar. 1997, IEEE Electron Device Letters, vol. 18, No. 3, pp. 81-83. (Year: 1997).*
(Continued)

*Primary Examiner* — Chad M Dicke
*Assistant Examiner* — Valerie N Newton
(74) *Attorney, Agent, or Firm* — Wolf, Greenfield & Sacks, P.C.

(57) ABSTRACT

A semiconductor device and a manufacturing method thereof are provided. The semiconductor device includes a substrate; an isolation layer in a first trench, defining an active region of the substrate; a gate structure in a second trench intersecting the active region; and first and second impurity regions spaced apart from each other by the gate structure. The gate structure includes a gate dielectric layer in the second trench; a first metal layer on the gate dielectric layer; and a gate capping layer on the first metal layer. The gate dielectric layer includes $D^+$ and $ND_2^+$ in an interface region, adjacent the first metal layer, and D is deuterium, N is nitrogen, and $D^+$ is positively-charged deuterium.

20 Claims, 20 Drawing Sheets

(51) Int. Cl.
  *H10B 12/00* (2023.01)
  *H10D 64/27* (2025.01)
  *H10D 64/66* (2025.01)

(56) References Cited

U.S. PATENT DOCUMENTS

| | | | |
|---|---|---|---|
| 6,891,238 | B2 | 5/2005 | Mitani et al. |
| 7,157,359 | B2 | 1/2007 | Park et al. |
| 7,507,595 | B2 | 3/2009 | Hyun |
| 7,658,859 | B2 | 2/2010 | Hayashi |
| 8,084,834 | B2 | 12/2011 | Kaneko et al. |
| 9,502,307 | B1* | 11/2016 | Bao .................... H01L 29/42372 |
| 2002/0086507 | A1* | 7/2002 | Park .................. H01L 21/28088 438/585 |
| 2005/0003680 | A1 | 1/2005 | Weimer et al. |
| 2006/0191867 | A1* | 8/2006 | Hayashi ............ H01L 21/76807 257/E21.256 |
| 2007/0259500 | A1 | 11/2007 | Cheng et al. |
| 2015/0294975 | A1* | 10/2015 | Nakata .............. H01L 21/02247 257/334 |
| 2018/0174845 | A1 | 6/2018 | Jang et al. |
| 2019/0296146 | A1 | 9/2019 | Shimizu et al. |

FOREIGN PATENT DOCUMENTS

| | | |
|---|---|---|
| KR | 100384346 B1 | 5/2003 |
| KR | 20180070768 A | 6/2018 |

OTHER PUBLICATIONS

Nicolet, M.A. "Diffusion Barriers in Thin Films" Thin Solid Films 52:415-443 (1978).

Nishi, Yoshio "Electron Spin Resonance in SiO2 Grown on Silicon" Japanese Journal of Applied Physics 5:333 (1966).

Ting, C. Y. "TiN formed by evaporation as a diffusion barrier between Al and Si" Journal of Vacuum Science and Technology 21(1):14-18 (1982).

Choi et al. "New Approaches to Improve the Endurance of TiN/HfO2/TiN Capacitor during the Back-end Process for 70nm DRAM Device IEEE International Electron Devices Meeting 2003 (pp. 661-664) (Dec. 2003)".

Fowles et al. "Studies on the Behuviour of Halides of the Transition Metals with Ammonia. Part II. The Reaction of Titanium Tetrachloride with Ammonia" Journal of the Chemical Society (pp. 2588-2593) (Jan. 1953).

Jun et al. "Kinetics of TiN Chemical Vapor Deposition Process using TiCl4 and NH3 for ULSI Diffusion Barrier Applications: Relationship between Step Coverage and NH3 Partial Pressure" Japanese Journal of Applied Physics 43(10):7287-7291 (2004).

Kurtz et al. "Chemical Vapor Deposition of Titanium Nitride At Low Temperatures" Thin Solid Films 140:277-290 (1986).

Oh et al. "TiN/HfO2/TiN Capacitor Technology Applicable to 70nm Generation DRAMs" 2003 Symposium on VLSI Technology Digest of Technical Papers (pp. 73-74) (Jul. 2003).

Ostling et al. "A Comparative Study of the Diffusion Barrier Properties of TiN and ZrN" Thin Solid Films 145:81-88 (1986).

Ramanuja et al. "Synthesis and characterization of low pressure chemically vapor deposited titanium nitride films using TiCl4 and NH3" Materials Letters 57:261-269 (Dec. 2002).

Saeki et al. "Reaction Process of Titanium Tetrachloride with Ammonia in the Vapor Phase and Properties of the Titanium Nitride Formed" Bulletin of the Chemical Society of Japan 55(10):3193-3196 (1982).

Tsetseris et al. "Physical mechanisms of negative-bias temperature instability" Applied Physics Letters 86(14):142103 (2005).

Yokozawa et al. "First-principles calculations for charged states of hydrogen atoms in SiO2" Physical Review B 55(20):13783 (May 1997).

* cited by examiner

SEMICONDUCTOR DEVICES AND METHODS OF MANUFACTURING THE SAME

CROSS-REFERENCE TO RELATED APPLICATION(S)

This application is a continuation of and claims priority to U.S. patent application Ser. No. 16/927,463, filed on Jul. 13, 2020, which claims the benefit of priority to Korean Patent Application No. 10-2019-0141208, filed on Nov. 6, 2019 in the Korean Intellectual Property Office, the disclosures of which are incorporated herein by reference in their entirety.

BACKGROUND

1. Field

The present disclosure relates to semiconductor devices and, particularly, to semiconductor devices and methods of manufacturing the same.

2. Description of Related Art

As a semiconductor device is becoming highly integrated, sizes of patterns configuring the semiconductor device are being reduced. Semiconductor devices released as the same product may need to include identical patterns having an identical size so as to have identical levels of performance or properties. As the patterns are becoming smaller, however, deviations in the pattern sizes are increasing.

SUMMARY

An aspect of the present disclosure may provide a semiconductor device having improved insulating properties in a gate dielectric layer.

According to an aspect of the present disclosure, a semiconductor device may include a substrate, an isolation layer in a first trench, defining an active region of the substrate, a gate structure in a second trench intersecting the active region, and first and second impurity regions spaced apart from each other by the gate structure. The gate structure includes a gate dielectric layer in the second trench, a first metal layer on the gate dielectric layer, and a gate capping layer on the first metal layer, and the gate dielectric layer includes $D^+$ and $ND_2^+$ in an interface region, adjacent the first metal layer, and D is deuterium, N is nitrogen, and $D^+$ is positively-charged deuterium.

According to an aspect of the present disclosure, a semiconductor device may include a gate trench intersecting an active region, and a gate structure in the gate trench. The gate structure includes a gate dielectric layer in the gate trench, a first metal layer on the gate dielectric layer, and a gate capping layer on the first metal layer, the gate dielectric layer includes $D^+$ and $ND_2^+$ and the first metal layer includes D and $ND_2$, and a concentration of $D^+$ in the gate dielectric layer is greater than a concentration of $ND_2^+$ in the gate dielectric layer. Also, D is deuterium, N is nitrogen, and $D^+$ is positively-charged deuterium.

According to an aspect of the present disclosure, a semiconductor device may include a substrate, an isolation layer in a first trench, defining an active region of the substrate, and a gate structure in a second trench intersecting the active region. The gate structure includes a gate dielectric layer in the second trench and including silicon oxide, a first metal layer on the gate dielectric layer and including titanium nitride (TiN), and a gate capping layer on the first metal layer, and the gate dielectric layer has first and second defects and includes $D^+$ and $ND_2^+$ trapped in the first and second defects, respectively. Also, D is deuterium, N is nitrogen, and $D^+$ is positively-charged deuterium.

DETAILED DESCRIPTION

Figure 1:
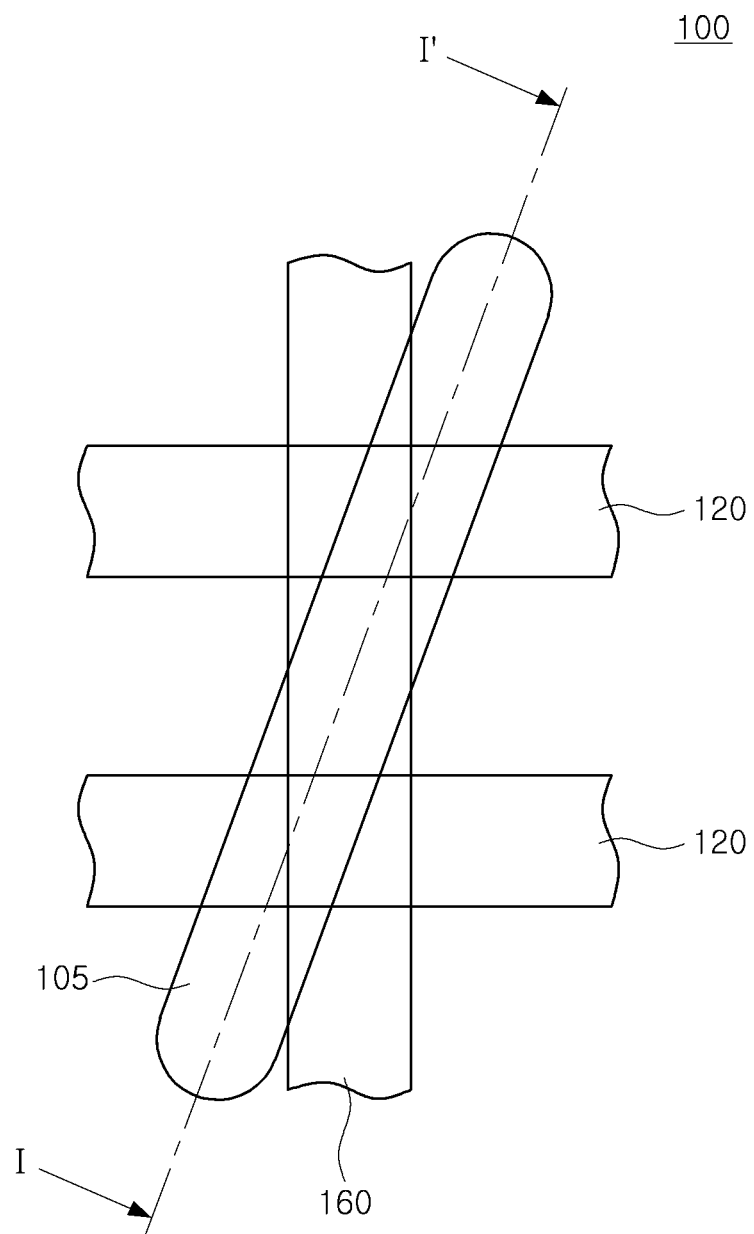
FIG. 1 is a plan view of a semiconductor device according to example embodiments of the present disclosure.

FIG. 1 is a plan view of a semiconductor device according to example embodiments of the present disclosure.

Figure 2A:
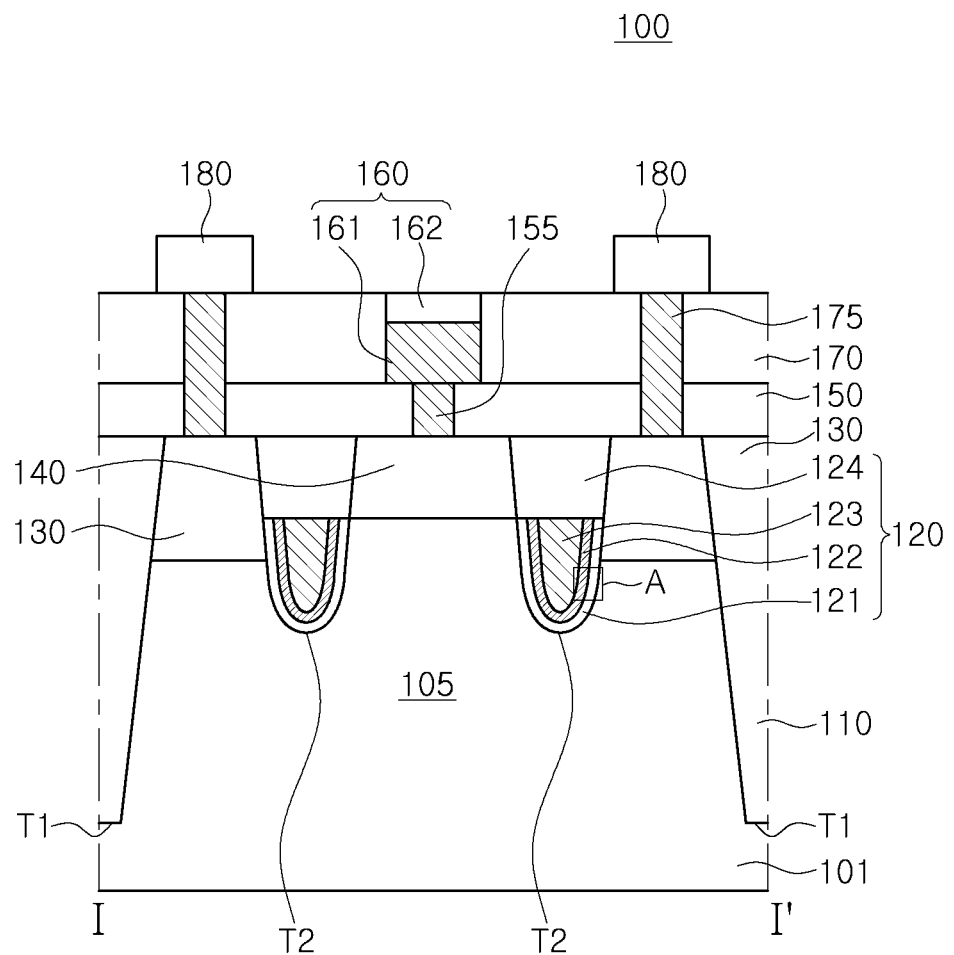
FIG. 2A is a cross-sectional view of a semiconductor device according to example embodiments.

FIG. 2A is a cross-sectional view of a semiconductor device according to example embodiments. FIG. 2A illustrates a cross-section of the semiconductor device of FIG. 1 taken along line I-I'. For convenience of description, constitutional elements of the semiconductor device are illustrated in FIGS. 1 and 2A. A dynamic random access memory (DRAM) is illustrated as an example of the semiconductor device according to the technical concept and example embodiments of the present disclosure, but the technical concept of the present disclosure is not limited thereto.

Referring to FIGS. 1 and 2A, a semiconductor device 100 may include a substrate 101, an active region 105 on the substrate 101, an isolation layer 110 in a first trench T1 and surrounding the active region 105, a gate structure 120 inside a second trench T2 intersecting the active region 105, and first and second impurity regions 130 and 140 separated from each other by the gate structure 120 in the active region 105, a first insulating layer 150 on the isolation layer 110 and the gate structure 120, a bit line contact 155 intersecting the first insulating layer 150 and electrically connected to the second impurity region 140, a bit line structure 160 on the first insulating layer 150, a second insulating layer 170 covering the bit line structure 160 on the first insulating layer 150, a storage node contact 175 intersecting the first and second insulating layers 150 and 170 and electrically connected to the first impurity region 130, and an data storage element 180 on the second insulating layer 170. The gate structure 120 may include a gate dielectric layer 121, a first metal layer 122, a second metal layer 123 and a gate capping layer 124, and the bit line structure 160 may include a bit line 161 and a bit line capping layer 162.

The substrate 101 may include a semiconductive material, for example, group IV semiconductor, groups III-V compound semiconductor or groups II-VI compound semiconductor. For example, the group IV semiconductor may include silicon, germanium or silicon-germanium. The substrate 101 may be provided as a bulk wafer, an epitaxial layer, a silicon-on-insulator (SOI) layer, a semiconductor-on-insulator (SeOI) layer, or the like.

The active region 105 is defined in the substrate 101 by the isolation layer 110 and may be disposed to extend in one direction. The active region 105 may have a structure of an active fin protruding from the substrate 101. The active region 105 may be disposed to protrude from an upper surface of the isolation layer 110 by a pre-determined height. The active region 105 may include a portion of the substrate 101 and an epitaxial layer grown from the substrate 101. According to example embodiments, the active region 105 may include impurities, and at least a portion of the active regions 105 may include impurities of different conductive types, but the present disclosure is not limited thereto.

The isolation layer 110 may define the active region 105 on the substrate 101. The isolation layer 110 may be disposed in a first trench T1 surrounding the active region 105 in the substrate 101. The isolation layer 110 may be a shallow trench isolation layer. The isolation layer 110 may expose upper side walls of the active region 105. According to example embodiments, the isolation layer 110 may include a region extending into a deep lower portion of the substrate 101 between the active regions 105. For example, the isolation layer 110 may be an insulating material, for example, an oxide, a nitride or a combination thereof, filling the first trench T1 formed in the substrate 101.

The gate structure 120 may be disposed in a second trench T2 intersecting the active region 105 and extending into the isolation layer 110. The gate structure 120 may include a gate dielectric layer 121, a first metal layer 122, a second metal layer 123 and a gate capping layer 124. The second trench T2 may be a trench formed in the substrate 101 to embed a gate electrode of a transistor. The second trench T2 may thus be referred to as a "gate trench."

The gate dielectric layer 121 may partially cover an inside wall of the second trench T2. The gate dielectric layer 121 may be located between the inside wall of the second trench T2 and the first metal layer 122, and may be disposed to surround a side surface and a lower surface of the first metal layer 122. The gate dielectric layer 121 may include an oxide, a nitride or a high-k substance. The high-k substance may be a dielectric material having a dielectric constant higher than that of silicon oxide ($SiO_2$) film. The high-k substance may be any one of, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$) and praseodymium oxide ($Pr_2O_3$). When the gate dielectric layer 121 includes the high-k substance, the gate dielectric layer 121 covers the active region 105 in an unillustrated region while including a portion extended on the isolation layer 110.

When the gate dielectric layer 121 is a silicon oxide (ex., $SiO_2$) layer, the gate dielectric layer 121 may include $D^+$ and/or $ND_2^+$ diffused by rapid thermal nitridation, which will be described herein. D may be a deuterium atom, and the symbol $^+$ indicates a positive charge. The gate dielectric layer 121 may include $D^+$ and/or $ND_2^+$ in an interface region, adjacent to the first metal layer 122. The $D^+$ and the $ND_2^+$ are diffused by rapid thermal nitridation from the first metal layer 122 to be distributed in the interface region and may be distributed in the gate dielectric layer 121. Accordingly, the first metal layer 122 may also include deuterium and/or nitrogen atoms (e.g., D and/or $ND_2$). A concentration of $D^+$ in the interface region may be greater than that of $ND_2^+$. The gate dielectric layer 121 may have a concentration gradient of $D^+$ or $ND_2^+$ between an interface between the active region 105 and the gate dielectric layer 121 and an interface between the gate dielectric layer 121 and the first metal layer 122. For example, the concentration gradient may be a concentration gradient in which the concentration of $D^+$ or $ND_2^+$ increases from an interface between the active region 105 and the gate dielectric layer 121 to an interface between the gate dielectric layer 121 and the first metal layer 122. In particular, the concentration of $D^+$ or $ND_2^+$ may be higher at (a) the interface between the gate dielectric layer 121 and the first metal layer 122 than at (b) the interface between the active region 105 and the gate dielectric layer 121.

When the gate dielectric layer 121 does not have sufficient insulating properties, an amount of current flowing between source/drain regions is reduced, thereby deteriorating performance of the semiconductor device. A reason for the insufficient insulating properties of the gate dielectric layer 121 is the presence of defects in the gate dielectric layer 121. The defects in the gate dielectric layer 121 are caused by a partial disturbance of an atomic arrangement of the gate dielectric layer 121 by an external heat treatment process or diffusion of the impurities. When electrons, holes, or charged impurities are trapped in such defects, the defects exhibit electrical characteristics of the charge, thereby deteriorating the insulating properties of the gate dielectric layer 121.

Defects, which can occur in the gate dielectric layer 121, may be various; for example, when the gate dielectric layer 121 includes $SiO_2$, nonbridging oxygen, vacancies, or the like, may be generated in the gate dielectric layer 121. Causes of such defects may be hydrogen diffused in the gate dielectric layer 121 or hydrogen-binding ions ($H^+$, an OH radical, an NH radical, or the like). Oxygen vacancies in which oxygen is absent in at a place of oxygen in the vacancies may appear as a defect.

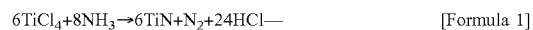

$$6TiCl_4 + 8NH_3 \rightarrow 6TiN + N_2 + 24HCl— \qquad \text{[Formula 1]}$$

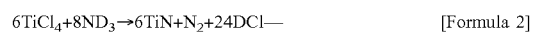

$$6TiCl_4 + 8ND_3 \rightarrow 6TiN + N_2 + 24DCl— \qquad \text{[Formula 2]}$$

Conventionally, the first metal layer 122 may be formed by carrying out chemical vapor deposition (CVD) at about 600° C. using $TiCl_4$ and $NH_3$ as precursors, depositing a TiN layer, a product of the CVD, and removing byproducts $N_2$ and HCl (refer to Formula 1). During this process, due to the high temperature heat treatment, nitrogen (N) atoms, hydrogen (H) atoms, chlorine (Cl) atoms, or the like, are trapped in the oxygen vacancies in the gate dielectric layer 121 by diffusion or invade interstitial sites to induce a fixed charge, thereby shifting a threshold voltage of the transistor and deteriorating the performance of the semiconductor device.

Further, the nitrogen atoms, hydrogen atoms, or the like are diffused from the first metal layer 122 by $NH_3$ gas utilized in a rapid thermal process (RTP) after the first metal layer 122 is deposited and is trapped in the oxygen vacancies in the dielectric layer 121. Thus-induced fixed charge also deteriorates the performance of the semiconductor device.

In an example embodiment of the present disclosure, $ND_3$ gas containing deuterium, a hydrogen isotope, may be used instead of $NH_3$ gas during the deposition of the first metal layer 122 and the RTP. The deposition of the first metal layer 122 may proceed through a process of Formula 2. As a diffusion velocity of deuterium, which is heavier than hydrogen, is lower than a diffusion velocity of hydrogen, a concentration of deuterium diffused and distributed into the gate dielectric layer 121 may be relatively lowered, and generation of a fixed charge can be inhibited/prevented. This may result in a reduced fixed charge amount in the gate dielectric layer 121 and thus improved performance of the semiconductor device.

The first metal layer 122 may cover an inside wall of the gate dielectric layer 121. The first metal layer 122 may be located between the inside wall of the gate dielectric layer 121 and the second metal layer 123 and disposed to surround the second metal layer 123. The first metal layer 122 surrounds a side surface and a bottom surface of the second metal layer 123. The first metal layer 122 may include a TiN film, but is not limited thereto. A metal nitride such as TaN or tungsten nitride (WN), and/or a metal such as Al, W, molybdenum (Mo), or the like, or a semiconductor substance such as doped polysilicon may be included. The second metal layer 123 may include two or more multilayers. The second metal layer 123 may be a gate electrode of a transistor.

The gate capping layer 124 may be disposed on an uppermost surface of each of the gate dielectric layer 121, the first metal layer 122 and the second metal layer 123. The gate capping layer 124 may include one or more oxides, nitrides, and/or oxynitrides.

The first impurity region 130 and the second impurity region 140 may be disposed in the activity region 105. The first and second impurity regions 130 and 140 may be source/drain regions. Accordingly, the first impurity region 130 may be referred to as a "first source/drain region" while the second impurity region 140 may be referred to as a "second source/drain region." The first and second impurity regions 130 and 140 may be isolated and spaced apart from each other by the second trench T2.

In an example, the first and second impurity regions 130 and 140 may have a nonsymmetrical source/drain structure. For example, the second impurity region 140 may have a shallow junction depth compared to the first impurity region 130. For example, a depth from an upper surface of the active region 105 to a bottom of the second impurity region 140 may be smaller than a depth from the upper surface of the active region 105 to a bottom of the first impurity region 130.

The first and second insulating layers 150 and 170 may include at least one of, for example, oxides, nitrides and oxynitrides, and a low-k substance. The first insulating layer 150 may cover the first and second impurity regions 130 and 140 and the gate structure 120 and may be disposed to cover the isolation layer 110 in an unillustrated region.

The bit line contact 155 may penetrate the first insulating layer 150 and be electrically connected to the second impurity region 140. The bit line contact 155 may include any one of a metal semiconductor compound, polysilicon, a metal nitride film and a metal film.

The bit line structure 160 may include a bit line 161 and a bit line capping layer 162 on the bit line 161. The bit line 161 may be disposed on the first insulating layer 150. Although not illustrated, spacers may further be disposed on both sides of the bit line 161. The bit line 161 may include a conductive material, for example, a metal nitride such as TiN, TaN or WN, and/or a metal such as Al, W, Mo, or the like, or a semiconductor material such as doped polysilicon.

The storage node contact 175 may penetrate the first and second insulating layers 150 and 170 to be electrically connected to the first impurity region 130. The storage node contact 175 may include any one of a metal semiconductor compound, polysilicon, a metal nitride film and a metal film.

The data storage element 180 may be disposed on the second insulating layer 170 and may be electrically connected to the storage node contact 175 and the first impurity region 130. In an example embodiment, the data storage element 180 may be a DRAM capacitor. Alternatively, the data storage element 180 may be a data storage element of a memory device different from the DRAM. For example, the data storage element 180 may be a data storage element of a magnetic tunnel junction (MTJ) of a magnetoresistive RAM (MRAM).

Figure 2B:
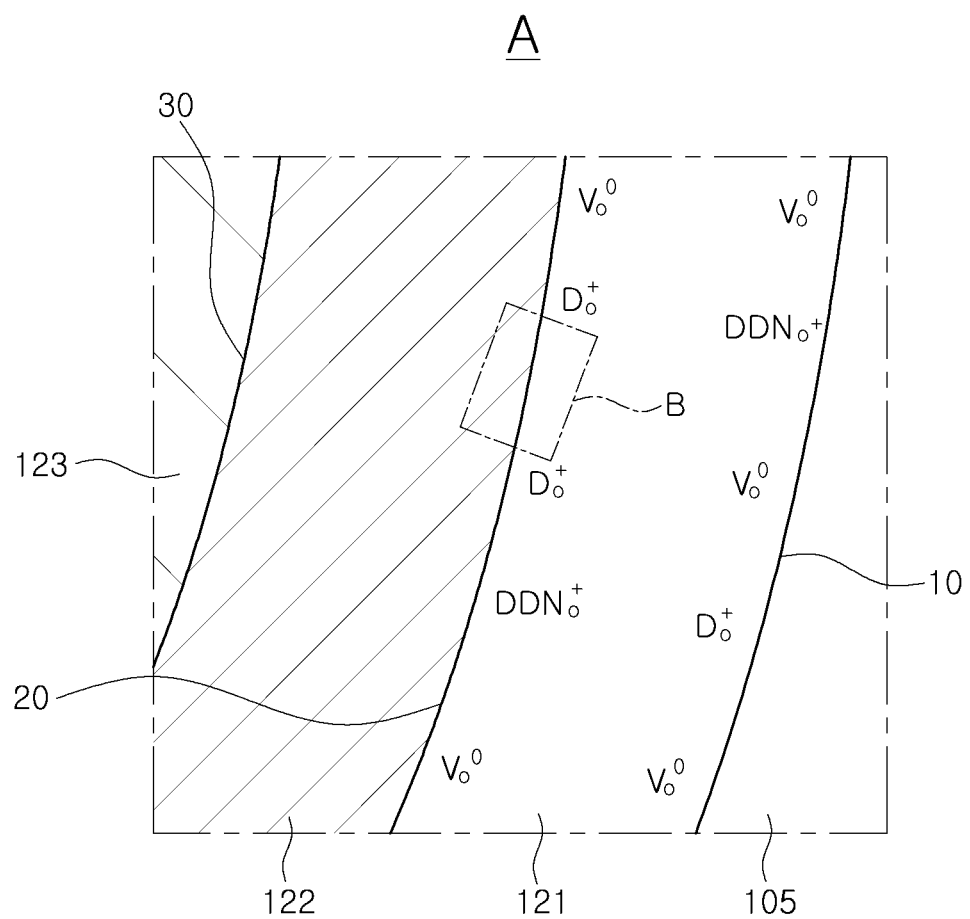
FIG. 2B is a partially enlarged view of a semiconductor device according to example embodiments.

FIG. 2B is a partially enlarged view of a semiconductor device according to example embodiments. FIG. 2B is an enlarged view of region "A" of FIG. 2A.

FIG. 2B illustrates an enlarged view of interfaces between the active region 105, the gate dielectric layer 121, the first metal layer 122 and the second metal layer 123. Based on FIG. 2B, an oxygen vacancy $V_o^0$ may be present and is schematically illustrated to describe the same. The oxygen vacancy $V_o^0$ may be a defect having one oxygen atom missing at a place thereof. A larger amount of the oxygen vacancies $V_o^0$ may be present in a region close to a first interface 10 between the active region 105 and the gate dielectric layer 121 and in a region close to a second interface 20 between the gate dielectric layer 121 and the first metal layer 122. $D^+$ or $ND_2^+$ may be trapped in the oxygen vacancies $V_o^0$ or invade interstitial sites. FIG. 2B also illustrates a third interface 30 between the first metal layer 122 and the second metal layer 123. A relatively larger amount of $D^+$ or $ND_2^+$ may be present on the first and second interfaces 10 and 20 compared to a center region of the gate dielectric layer 121. $H^+$ or $NH_2^+$ diffused from the first metal layer 122 may conventionally be distributed in the gate dielectric layer 121. In the present disclosure, however, $D^+$ or $ND_2^+$ may be diffused into the gate dielectric layer 121 from the first metal layer 122 and trapped in the oxygen vacancies $V_o^0$, as $ND_3$ gas is used in the RTN process. $D^+$ or $N_2^+$ is relatively heavier than $H^+$ or $NH_2^+$, and thus has a lower diffusion coefficient. In this regard, a concentration of $D^+$ or $ND_2^+$ present in the gate dielectric layer 121 may be relatively lower than that of conventional $H^+$ or $NH_2^+$.

$D^+$ that is trapped in an oxygen vacancy $V_o^0$ may be indicated as $D_o^+$. Also, $ND_2^+$ that is trapped in an oxygen vacancy $V_o^0$ may be indicated as $DDN_o^+$.

Figure 3A:
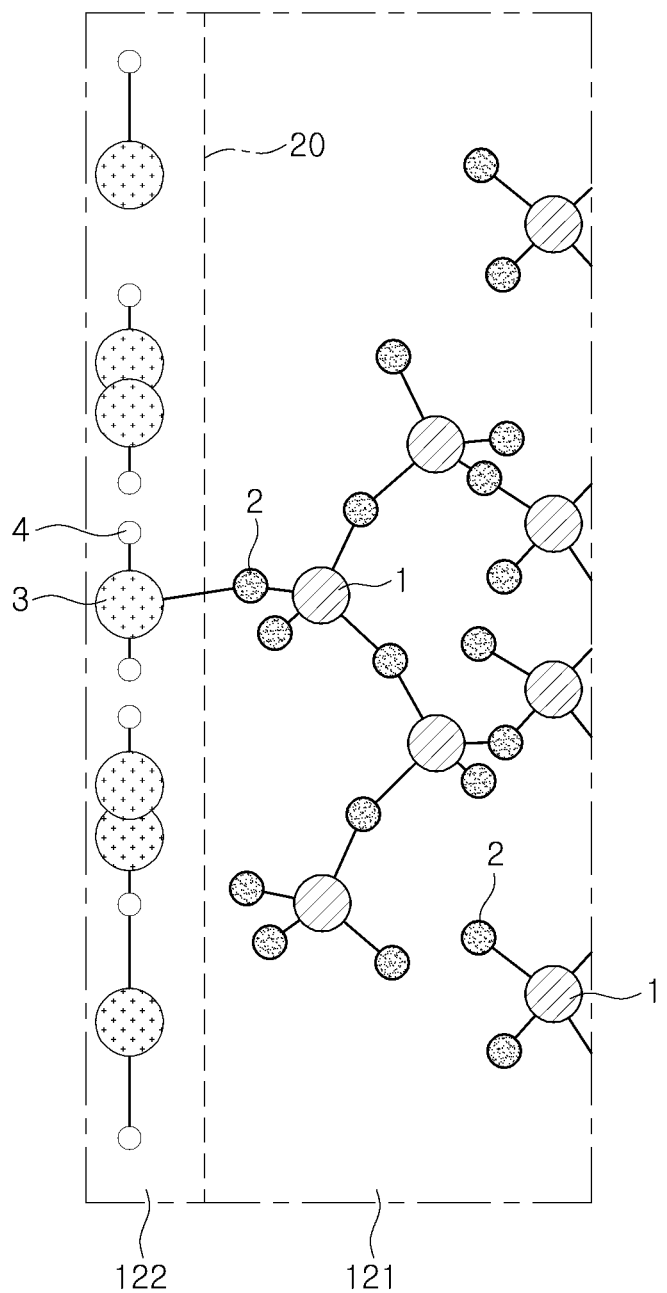
FIGS. 3A to 3D are diagrams of example atomic arrangements of a partially enlarged semiconductor device according to example embodiments.

FIG. 3A is a cross-sectional diagram of a semiconductor device according to example embodiments. FIG. 3A is an enlarged view of region "B" of FIG. 2B. FIG. 3A schematically illustrates an atomic arrangement adjacent to the second interface 20 to illustrate the technical concept of the present disclosure.

Based on FIG. 3A, a silicon atom 1 and an oxygen atom 2 forming a tetrahedral structure centered on the silicon atom 1 and disposed at each vertex of the tetrahedron to be bonded to the central silicon atom 1 are disposed in the gate dielectric layer 121. In the first metal layer 122, a titanium atom 3 bonded to a nitrogen atom 4 is disposed. The titanium atom 3 may be bonded to the oxygen atom 2 in the gate dielectric layer 121.

Figure 3B:
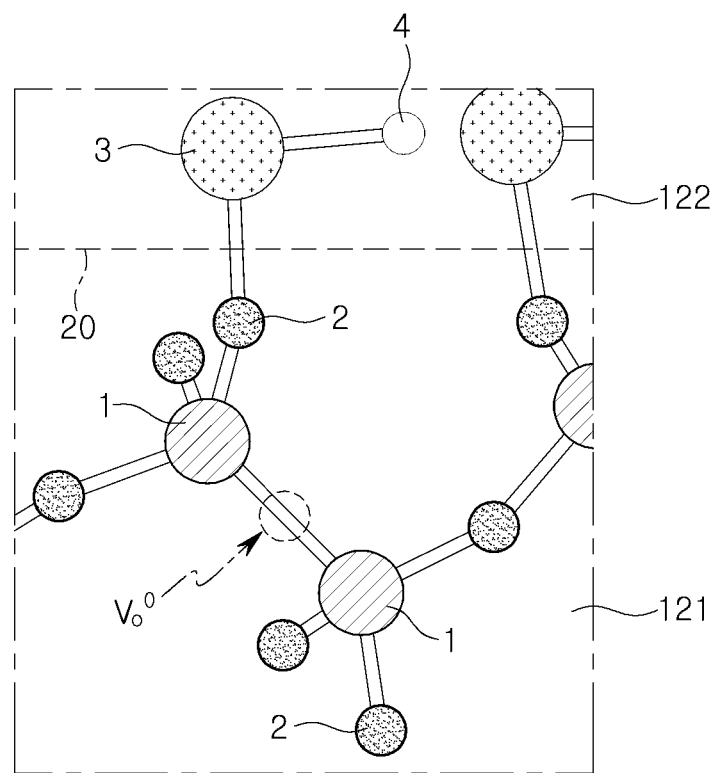

FIG. 3B is a cross-sectional diagram of a semiconductor device according to example embodiments. FIG. 3B is an enlarged view of a region corresponding to one region of FIG. 3A. FIG. 3B schematically illustrates an atomic arrangement adjacent to the second interface 20 to illustrate the technical concept of the present disclosure.

Based on FIG. 3B, a silicon atom 1 disposed close to the second interface 20 may be directly bonded to an adjacent silicon atom 1 without binding to an oxygen atom 2. An interspace between the two silicon atoms 1 may be an oxygen vacancy $V_o^0$, a one oxygen atom-missing defect.

Atoms or compounds diffused during the heat treatment are easily trapped in the oxygen vacancy $V_o^0$.

Figure 3C:
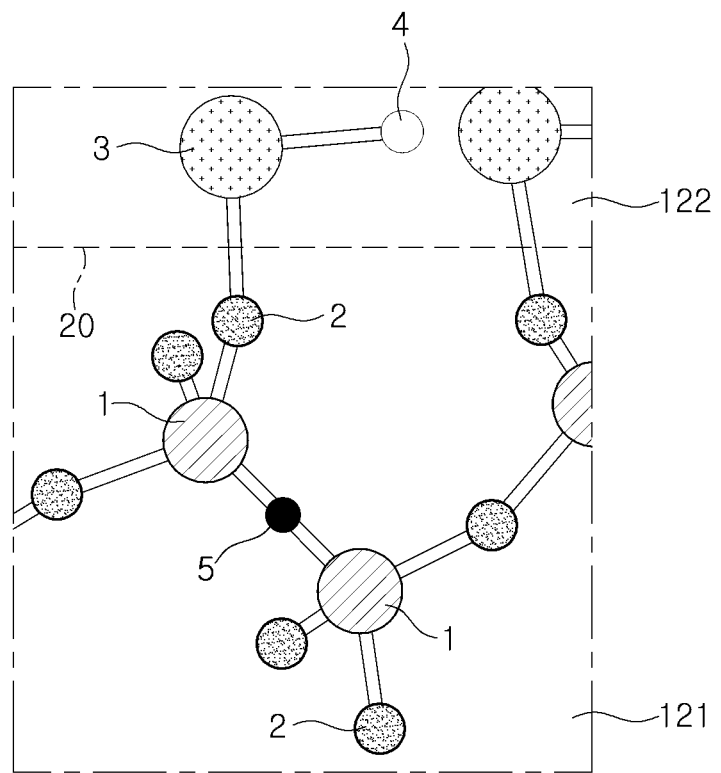

FIG. 3C is a cross-sectional diagram of a semiconductor device according to example embodiments. FIG. 3C is an enlarged view of a region corresponding to one region of FIG. 3A. FIG. 3C schematically illustrates an atomic arrangement adjacent to the second interface 20 to illustrate the technical concept of the present disclosure.

Based on FIG. 3C, in contrast to FIG. 3B, one or more deuterium atoms 5 are disposed in the oxygen vacancy $V_o^0$ to be bonded to adjacent silicon atoms 1. The deuterium atom(s) 5 may be present in the form of $D^+$. When a charged particle is trapped in the oxygen vacancy $V_o^0$, a magnetic dipole is induced, thereby deteriorating the insulating properties of the gate dielectric layer 121. In the present disclosure, however, deuterium atoms 5 instead of hydrogen atoms are trapped in the oxygen vacancy $V_o^0$ through the $ND_3$ gas. In this regard, relatively heavier deuterium atoms 5 have a lower diffusion velocity, and thus have a relatively lower concentration compared to when rapid thermal nitridation is performed through $NH_3$. As the concentration of the deuterium atoms 5 diffused and distributed into the gate dielectric layer 121 can be relatively reduced and the induction of a fixed charge can be suppressed, and thus an amount of the positive charge in the gate dielectric layer 121 can be reduced, the insulating properties can be improved, thereby improving the performance of the semiconductor device.

Figure 3D:
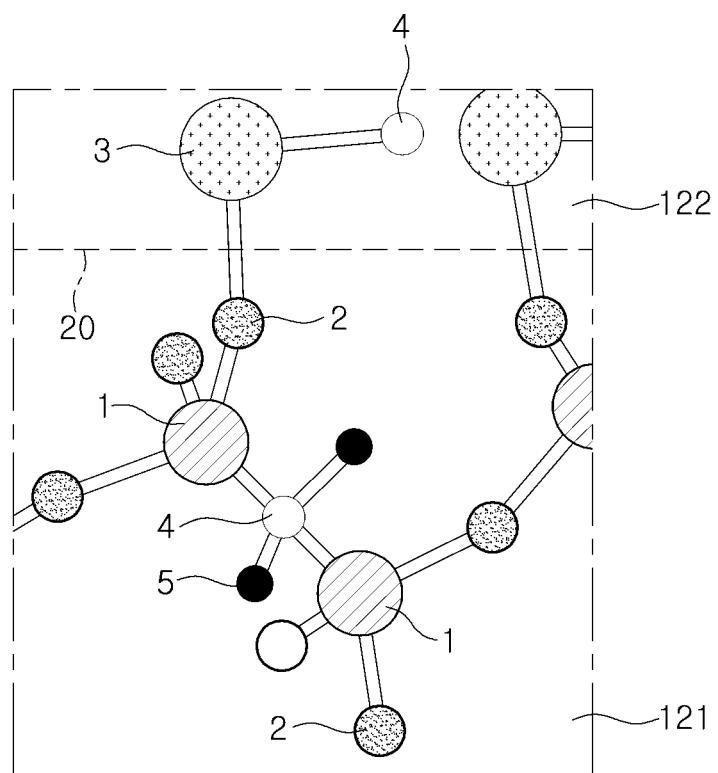

FIG. 3D is a cross-sectional diagram of a semiconductor device according to example embodiments. FIG. 3D is an enlarged view of a region corresponding to one region of FIG. 3A. FIG. 3D schematically illustrates an atomic arrangement adjacent to the second interface 20 to illustrate the technical concept of the present disclosure.

Based on FIG. 3D, in contrast to FIG. 3B, a nitrogen atom 4 is disposed in the oxygen vacancy $V_o^0$ to bond to an adjacent silicon atom 1, where two deuterium atoms 5 are bonded to the nitrogen atom 4, thereby forming $ND_2^+$. $ND_2^+$ is positively charged and thus may deteriorate the insulating properties of the gate dielectric layer 121. A concentration of $ND_2^+$ in the gate dielectric layer 121 may be relatively lower, however, when the RTN is performed through $ND_3$ gas, as compared to a concentration of $NH_2^+$ in the gate dielectric layer 121 when the RTN is performed through $NH_3$ gas. As a concentration of $ND_2^+$ diffused from the first metal layer 122 and distributed into the gate dielectric layer 121 may be relatively lowered, and the induction of a fixed charge can be suppressed, and thus, an amount of the positive charge in the gate dielectric layer 121 can be reduced, the insulating properties can be improved, thereby improving the performance of the semiconductor device.

Figure 4:
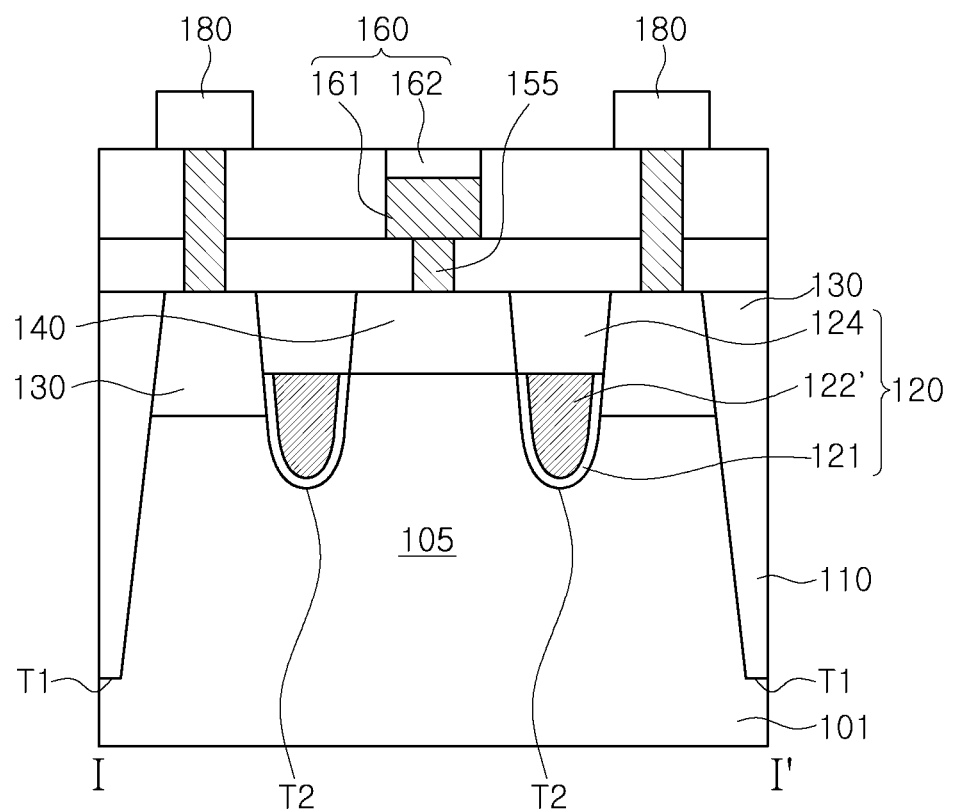
FIG. 4 is a cross-sectional view illustrating a semiconductor device according to example embodiments.

FIG. 4 is a cross-sectional view illustrating a semiconductor device according to example embodiments. FIG. 4 illustrates a region corresponding to a cross-section of the semiconductor device of FIG. 1 taken along line I-I'.

Referring to FIG. 4, comparing to the example embodiment described with reference to FIG. 2A, the second metal layer 123 may not be included. A first metal layer 122' may cover an inside wall of the gate dielectric layer 121 and may be disposed to fill a space on the gate dielectric layer 121 in the second trench T2. The first metal layer 122' may be wider than the first metal layer 122 of the example embodiment described with reference to FIG. 2A. The first metal layer 122' having a relatively greater width may have a longer RTN time. In this case, a difference in a concentration of $ND_2$ in the gate dielectric layer 121 when the RTN is performed through $ND_3$ gas and a concentration of $NH_2$ in the gate dielectric layer 121 when the RTN is performed through $NH_3$ gas may further increase. A concentration of $ND_2^+$ in a gate dielectric layer 121 may be relatively low. This will serve to improve insulating properties of the gate dielectric layer 121 as well as the performance of the semiconductor device.

Figure 5:
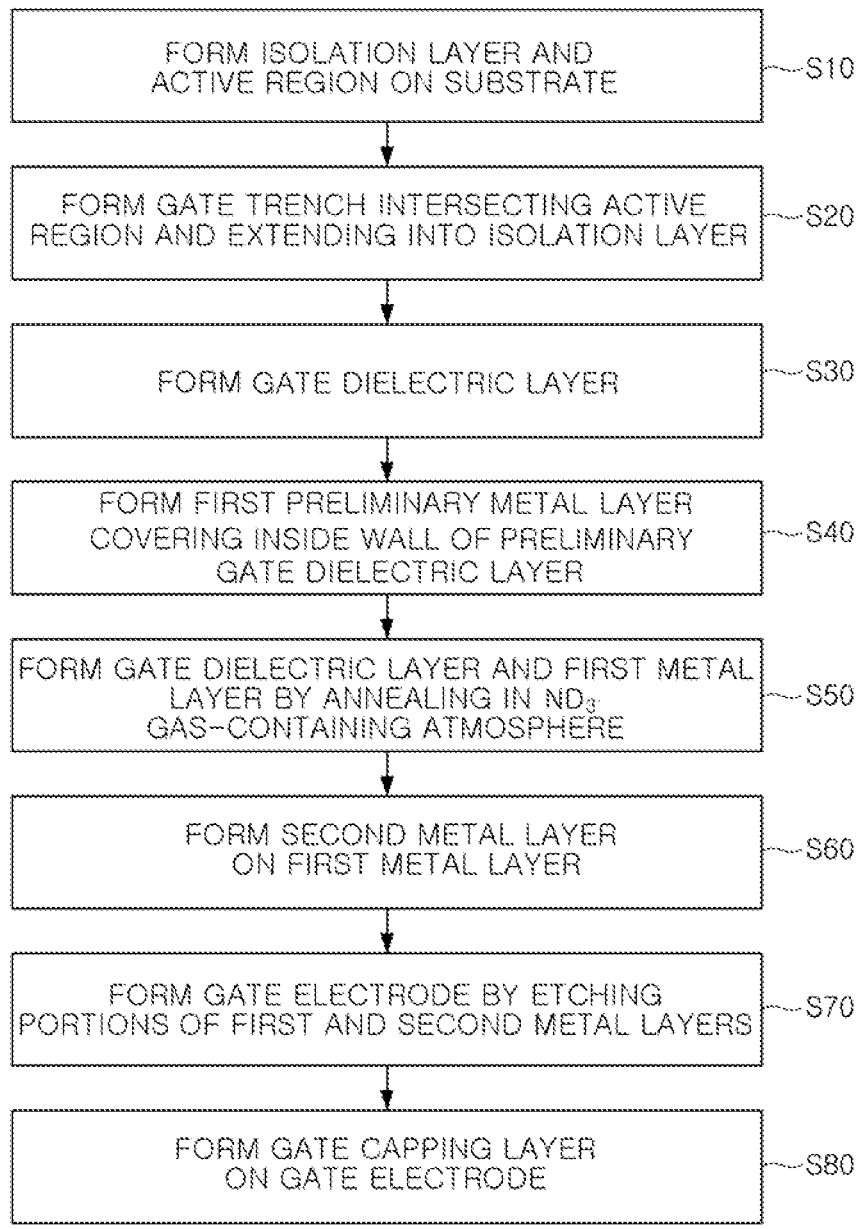
FIGS. 5 to 13 are diagrams illustrating a method for manufacturing a semiconductor device according to example embodiments in order.

A method for manufacturing a semiconductor device according to example embodiments will be described with reference to FIGS. 5 to 13. FIG. 5 is a flowchart illustrating a manufacturing method of the semiconductor device according to example embodiments, and FIGS. 6 to 13 are diagrams illustrating the manufacturing method of the semiconductor device according to example embodiments in order. FIGS. 6 to 13 describe a manufacturing method of the semiconductor device of FIG. 2A.

Figure 6:
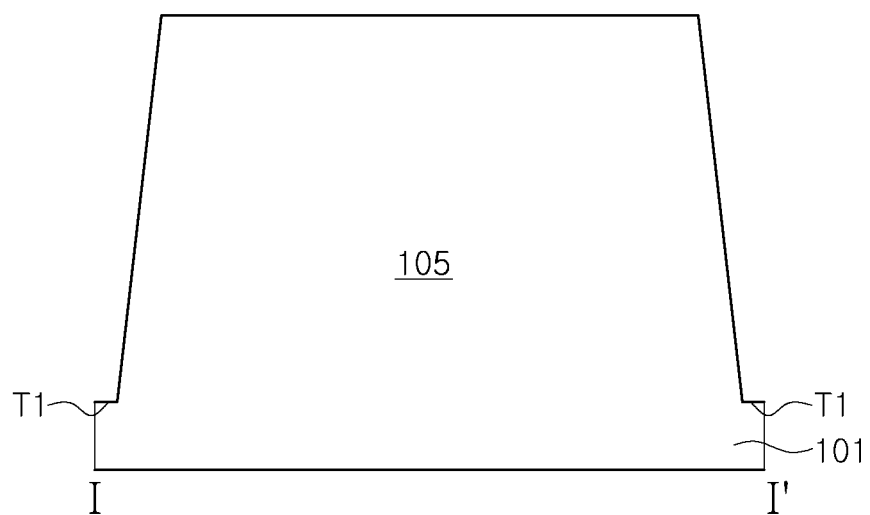
Figure 7:
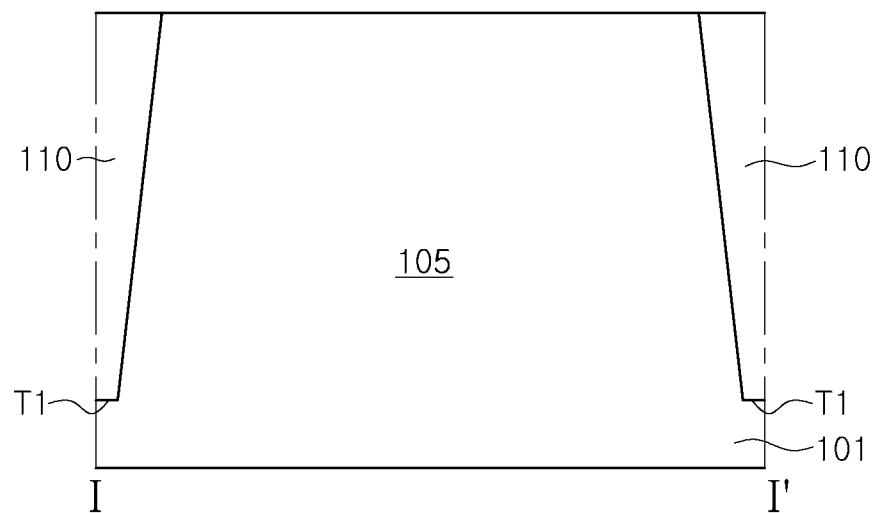

Referring to FIGS. 5 to 7, an isolation layer 110 and an active region 105 may be formed on a substrate 101 (S10).

The substrate 101 may include a semiconductor material. A first trench T1 extending in one direction may be formed on the substrate 101. The active region 105 is defined by an isolation layer 110 in the substrate 101 and may extend in the same direction as that in which the first trench T1 extends. The isolation layer 110 may be formed by shallow trench isolation (STI). The active region 105 may be surrounded by the first trench T1, and an upper end of the active region 105 may be formed to protrude upward a pre-determined height beyond an upper surface of the isolation layer 110.

Figure 8:
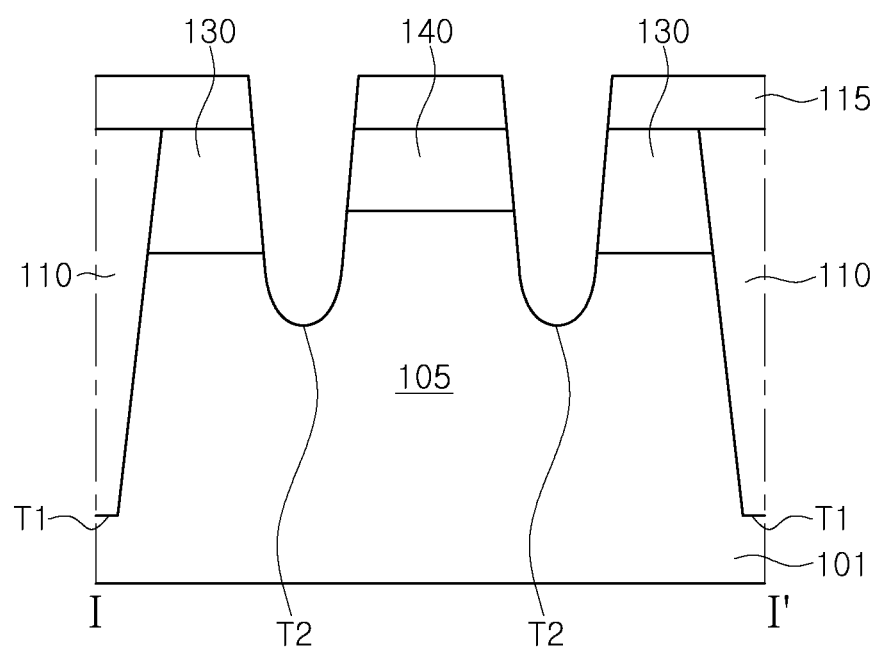

Referring to FIGS. 5 and 8, a gate trench T2 intersecting the active region 105 and extending into the isolation layer 110 may be formed (S20).

First and second impurity regions 130 and 140 may be formed in an upper portion of the active region 105. The first and second impurity regions 130 and 140 may include n-type or p-type impurities. In example embodiments, a lower surface of the first and/or second impurity regions 130 and 140 may be formed in a lower level than upper surfaces of the first and second metal layers 122 and 123. The first and second impurity regions 130 and 140 may have a nonsymmetrical source/drain structure. For example, the second impurity region 140 may have a shallow junction depth compared to the first impurity region 130. The first and second impurity regions 130 and 140 may be spaced apart from each other during formation of a gate trench T2. The gate trench T2 may be referred to as a second trench.

A mask pattern 115 exposing a region in which the gate trench T2 is to be formed may be formed on the isolation layer 110 and the active region 105.

The mask pattern 115 is used to form the gate trench T2 intersecting the active region 105 and extending into the isolation layer 110. The gate trench T2 may isolate the first and second impurity regions 130 and 140 from each other. The gate trench T2 may be a trench formed in the substrate 101 to embed a gate electrode of a transistor. For example, the gate trench T2 may be a trench formed in the substrate 101 to embed the first and second metal layers 122 and 123 of FIG. 2A.

Figure 9:
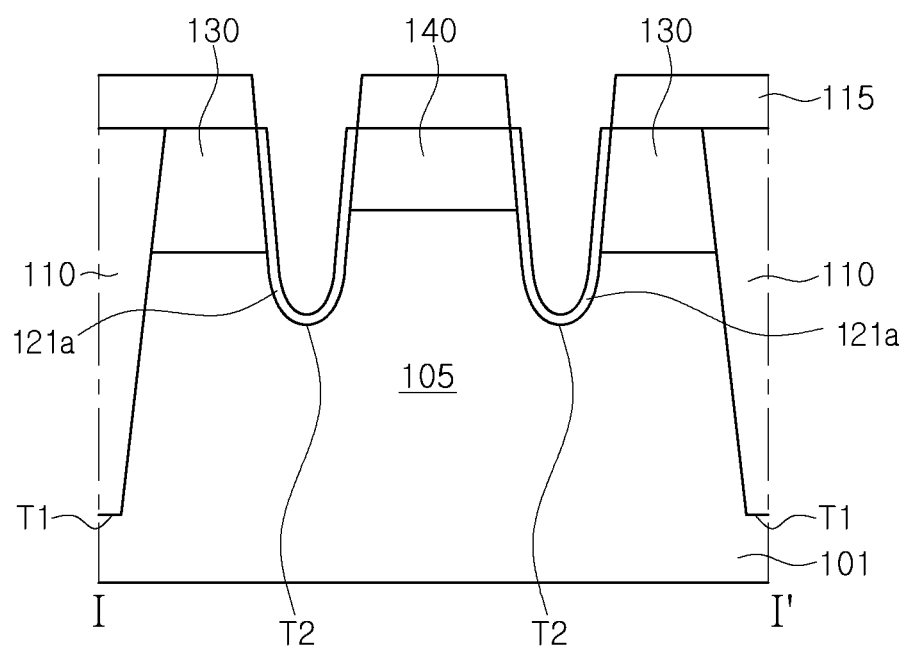

Referring to FIGS. 5 and 9, a preliminary gate dielectric layer 121a may be formed in the gate trench T2 (S30).

The preliminary gate dielectric layer 121a may conformally cover an inside wall of the gate trench T2 and may be formed by an atomic layer deposition (ALD) process and/or a thermal oxidation method.

Figure 10:
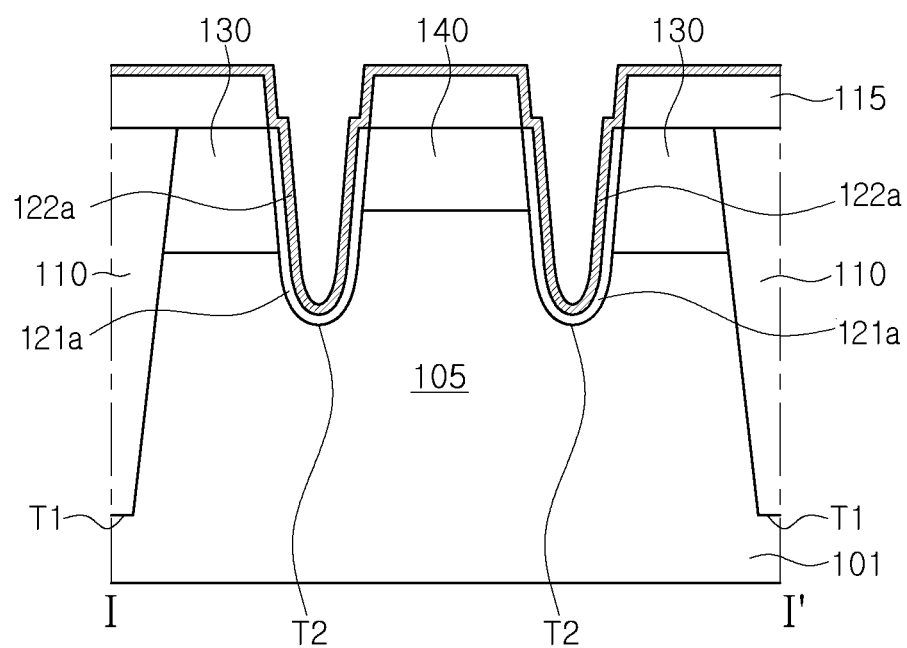

Referring to FIGS. 5 and 10, a first preliminary metal layer 122a may be formed on the preliminary gate dielectric layer 121a (S40).

The first preliminary metal layer 122a may conformally cover an inside wall of the preliminary gate dielectric layer 121a and may be deposited through a process of Formula 2.

The first preliminary metal layer 122a may be formed by using $TiCl_4$ and $ND_3$ as precursors to perform CVD at about 600° C. and 1 atm and depositing a TiN layer, a product, while removing byproducts $N_2$ and DCl.

In contrast to the above-described Formula 1, $ND_3$ is used to form the first preliminary metal layer 122a. As a diffusion velocity of deuterium, heavier than hydrogen, is lower than a diffusion velocity of hydrogen, a concentration of deuterium distributed in the preliminary gate dielectric layer 121a may be relatively lowered, and the induction of a fixed charge may be suppressed, and thus an amount of the positive charge in the preliminary gate dielectric layer 121a can be reduced, the performance of the semiconductor device may be improved.

Figure 11A:
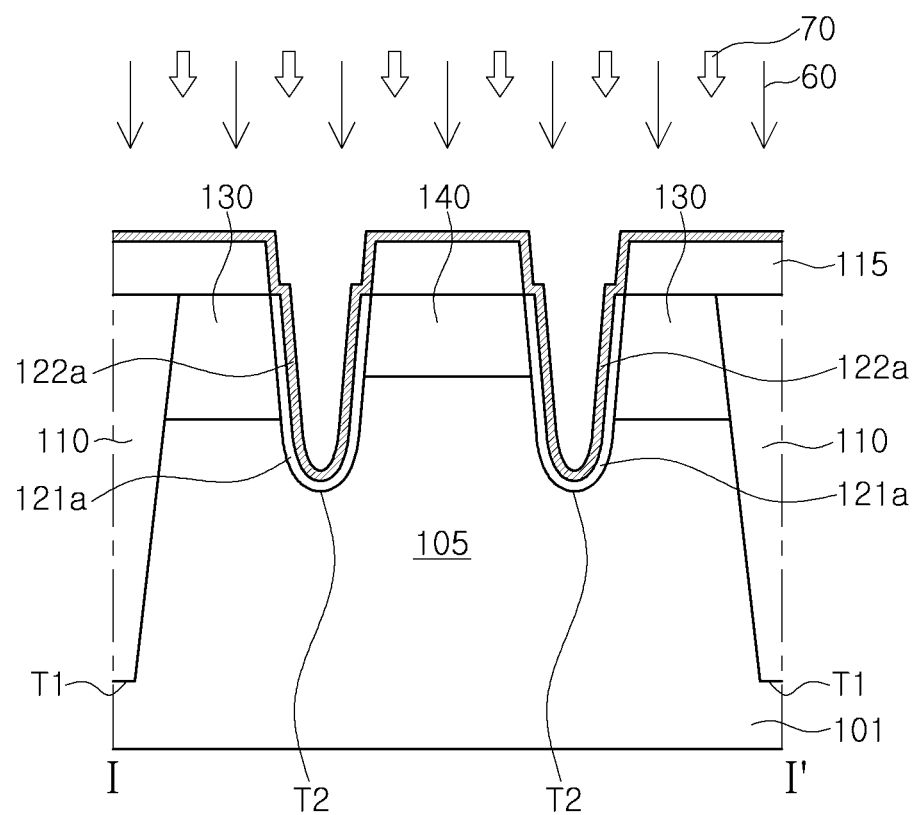

Based on FIGS. 5 and 11A, annealing process 70 is performed in an atmosphere containing $ND_3$ gas 60 to form the gate dielectric layer 121 and the first metal layer 122 (S50). The annealing process 70 in the atmosphere containing $ND_3$ gas 60 may be rapid thermal nitridation.

Rapid thermal nitridation (RTN) may be performed in an atmosphere containing $ND_3$ gas 60 at about 1 atmosphere (atm) and 650° C. to 750° C., particularly at about 700° C. The RTN enhances crystallinity of the first preliminary metal layer 122a to form the first metal layer 122. During the annealing, the nitrogen atom or $D^+$ may be diffused from the first metal layer 122 into the gate dielectric layer 121. $D^+$ or $ND_2^+$ may be trapped in oxygen vacancies $V_o^0$ or invade interstitial sites. As the RTN is performed using the $ND_3$ gas, $D^+$ or $ND_2^+$ may be diffused in the preliminary gate dielectric layer 121a to form the gate dielectric layer 121. As $D^+$ or $ND_2^+$ may be relatively heavier than $H^+$ or $NH_2^+$ and thus have a lower diffusion coefficient, a concentration of $D^+$ or $ND_2^+$ present in the gate dielectric layer 121 may be lower than that of $H^+$ or $NH_2^+$. This will suppress the induction of a fixed charge and reduce an amount of the positive charge in the gate dielectric layer 121, thereby improving the performance of the semiconductor device.

Figure 11B:
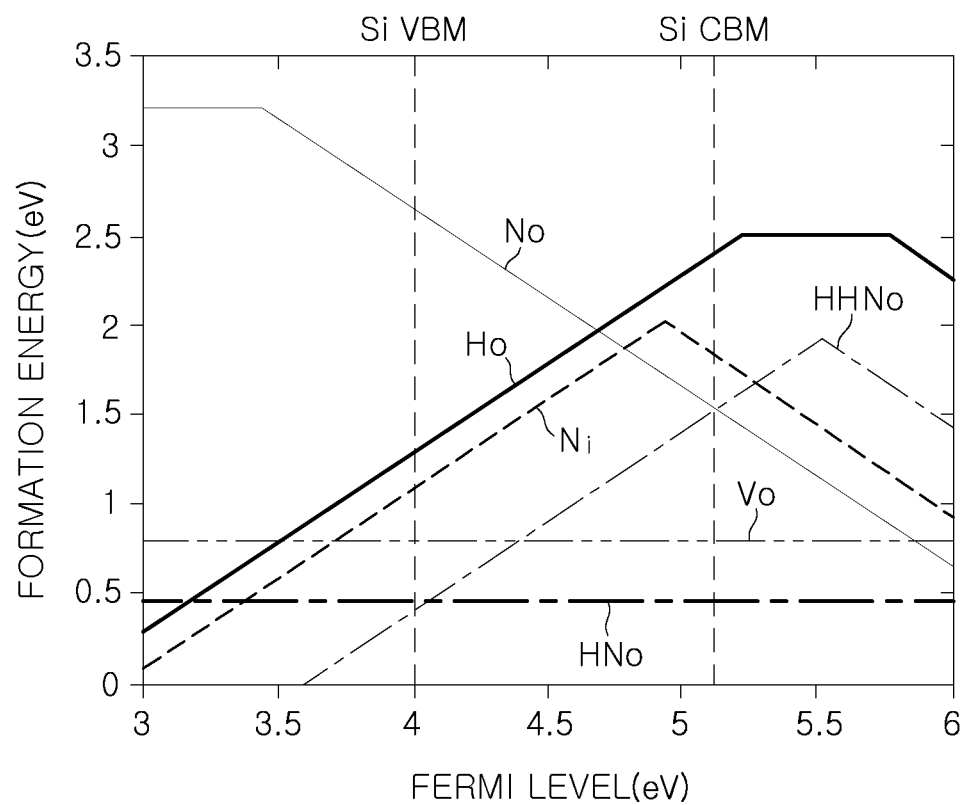

FIG. 11B illustrates formation energy according to a Fermi level of each atom or an atom compound in $SiO_2$ in a semiconductor device according to example embodiments.

In a valence band maximum (VBM) value of the silicon atom, formation energy of an oxygen vacancy $V_o$, an invasive hydrogen atom, hydrogen trapped in the oxygen vacancy $H_o$, an invasive nitrogen atom nitrogen $N_i$, trapped in the oxygen vacancy $N_o$, and $HHN_o$ trapped in the oxygen vacancy may be compared. A slope of a line illustrated by each atom refers to a charge condition of a defect. Si VBM illustrates the valence band maximum value of silicon (Si) and Si CBM illustrates the conduction band maximum value of silicon.

For example, at the Fermi level of 4 eV of the silicon atom, formation energy of $HHN_o$ trapped in the oxygen vacancy $V_o$ is the lowest. As a slope of a line illustrated by $HHN_o$ is 1, $NH_2^+$, having an electric charge of +1 in the oxygen vacancy $V_o$, is shown to be a most stable defect. According to FIG. 11B, when a hydrogen atom or a hydrogen compound is trapped in the oxygen vacancy $V_o$ in the $SiO_2$ defect, which results in a positive charge, the insulation properties of the dielectric layer may be deteriorated due to the positive charge.

Figure 11C:
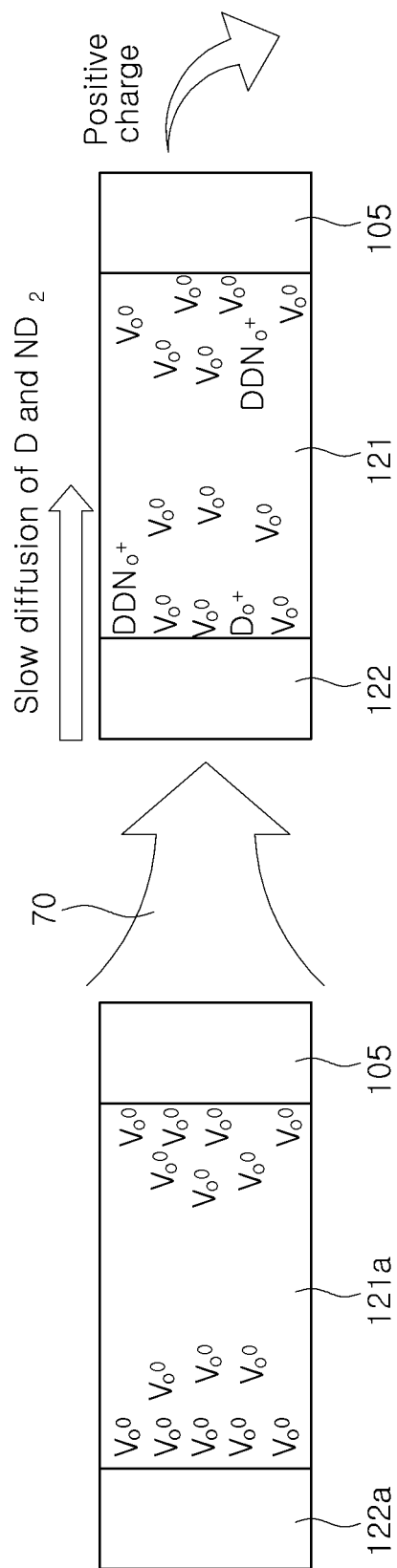

FIG. 11C illustrates diffusion of $D^+$ or $ND_2^+$ in $SiO_2$ in a semiconductor device according to example embodiments.

A TiN layer, an $SiO_2$ layer and an Si layer are disposed in order, which may correspond to the first preliminary metal layer 122a, the preliminary gate dielectric layer 121a and the active region 105, respectively. The preliminary gate dielectric layer 121a may include an oxygen vacancy $V_o^0$, where the oxygen vacancy $V_o^0$ is present in plural close to an interface between the first preliminary metal layer 122a and the preliminary gate dielectric layer 121a and an interface between the preliminary gate dielectric layer 121a and the active region 105. According to an example embodiment, as the annealing process 70 is performed in an atmosphere containing $ND_3$ gas, the oxygen vacancy $V_o^0$ in the preliminary gate dielectric layer 121a may be diffused from the first preliminary metal layer 122a toward the active region 105. As the annealing process 70 is performed in an atmosphere containing $ND_3$ gas, $D^+$ or $DDN_o^+$ may also be diffused in the preliminary gate dielectric layer 121a. The gate dielectric layer 121 and the first metal layer 122 may be formed by performing the annealing process 70 in an atmosphere containing $ND_3$ gas. Deuterium is heavier than hydrogen and may thus be diffused in a lower amount, and a concentration of $D^+$ or $DDN_0^+$ in the gate dielectric layer 121 may be relatively low. Accordingly, an amount of the positive charge in the gate dielectric layer 121 may be reduced, thereby improving the performance of the semiconductor device.

Figure 12:
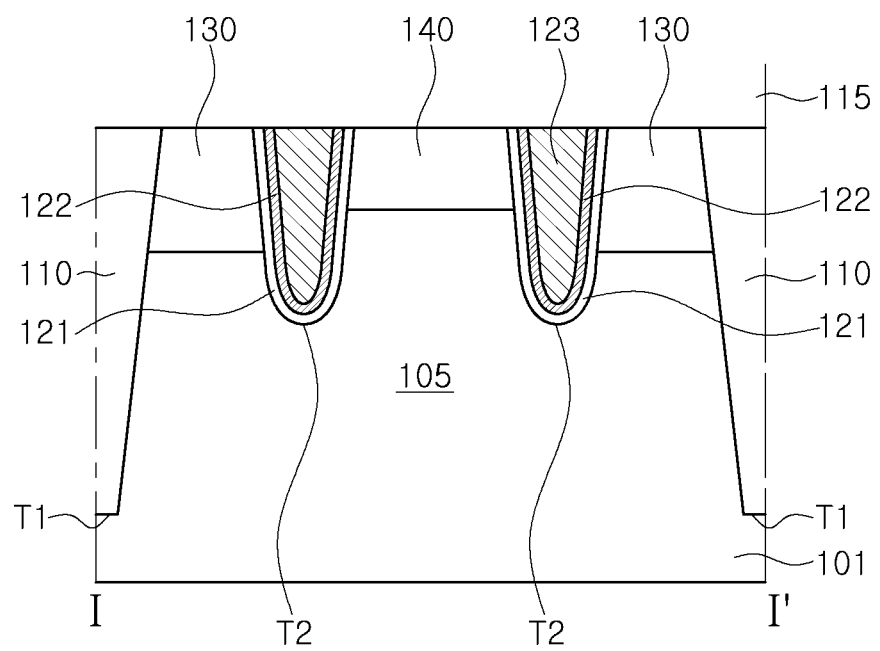

Referring to FIGS. 5 and 12, a second metal layer 123 may be formed on the first metal layer 122 (S60).

The second metal layer 123 may include a conductive material and may be formed to fill the second trench T2 together with the gate dielectric layer 121 and the first metal layer 122.

Figure 13:
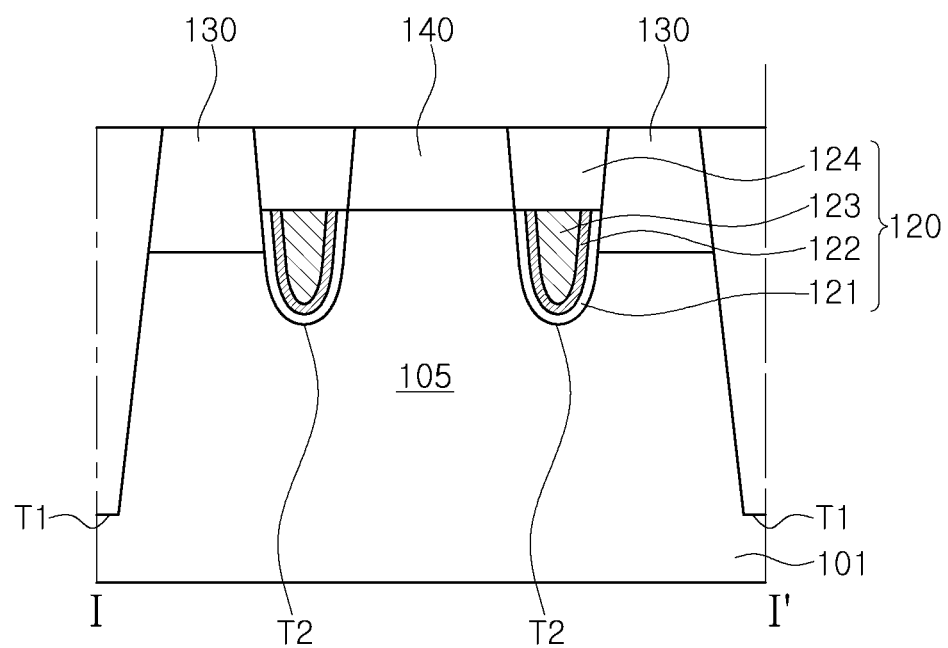

Referring to FIGS. 5 and 13, portions of the first metal layer 122 and the second metal layer 123 may be etched to form a gate electrode (S70), and a gate capping layer 124 may be formed on the gate electrode (S80).

Referring to FIGS. 1 and 2A, the first insulating layer 150 covering the first and second impurity regions 130 and 140 and the gate structure 120, a bit line contact 155 intersecting the first insulating layer 150 and electrically connected to the second impurity region 140, a bit line structure 160 including a bit line 161 and a bit line capping layer 162, a second insulating layer 170 covering the first insulating layer 150, a storage node contact 175 intersecting the second insulating layer 170 to be electrically connected to the first impurity region 130 and a data storage element 180 electrically connected to the storage node contact 175 on the second insulating layer 170 may be formed.

Figure 14:
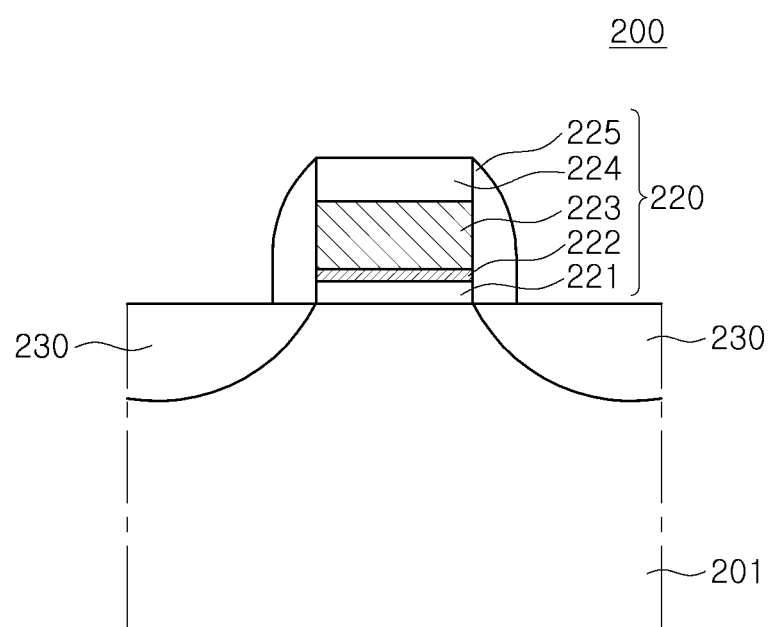
FIG. 14 is a cross-sectional view illustrating a semiconductor device according to example embodiments.

FIG. 14 is a cross-sectional view illustrating a semiconductor device according to example embodiments. FIG. 14 illustrates a region corresponding to a cross-section of the semiconductor device of FIG. 1 taken along line I-I'.

Based on FIG. 14, a semiconductor device 200 may include a substrate 201, a gate structure 220 including a gate dielectric layer 221 on the substrate 201, a first metal layer 222 on the gate dielectric layer 221, a second metal layer 223 on the first metal layer 222, a gate capping layer 224 on the second metal layer 223 and spacer layers 225 on side walls of the first and second metal layers 222 and 223.

The gate dielectric layer 221 and the first metal layer 222 may be formed as described with reference to FIGS. 5 to 13. The gate dielectric layer 221 may include a relatively low concentration of $D^+$ or $DDN_o^+$. This serves to suppress the induction of a fixed charge and to reduce the amount of positive charges in the gate dielectric layer 221, thereby improving the performance of the semiconductor device. The technical concept of the present disclosure is not limited to a particular semiconductor device and may be applied to various semiconductor devices, such as a FinFET transistor, a multi-bridge channel FET (MBCFET™) transistor, or the like, forming a constitution corresponding to the gate dielectric layer 221.

As set forth above, defects with positive charges in a gate dielectric layer can be reduced by $ND_3$ rapid thermal nitridation, and insulating properties of the gate insulating layer are improved, such that a semiconductor device having improved electrical characteristics can be provided.

Various advantages and beneficial effects of the present disclosure are not limited to the above descriptions. While example embodiments have been shown and described above, it will be apparent to those skilled in the art that modifications and variations could be made without departing from the scope of the present disclosure as defined by the appended claims.

What is claimed is:

1. A method of manufacturing a semiconductor device, the method comprising: forming an isolation layer and an active region on a substrate; forming a gate trench intersecting the active region and extending into the isolation layer; forming a preliminary gate dielectric layer in the gate trench; forming a preliminary metal layer on the preliminary gate dielectric layer; and converting the preliminary metal layer and the preliminary gate dielectric layer into a first metal layer and a gate dielectric layer by performing an annealing process in an atmosphere containing $ND_3$ gas, wherein D is deuterium, N is nitrogen, and $D^+$ is positively-charged deuterium, and wherein the annealing process includes distributing $D^+$ and $ND_2^+$ diffused from the first metal layer into the gate dielectric layer, and a concentration of the $D^+$ in the gate dielectric layer is greater than a concentration of the $ND_2^+$ in the gate dielectric layer.

2. The method of claim 1, wherein the gate dielectric layer includes the $D^+$ and the $ND_2^+$ in an interface region that is adjacent the first metal layer.

3. The method of claim 2,
wherein the gate dielectric layer includes silicon oxide,
wherein the $D^+$ in the interface region comprises a first deuterium atom that is bonded to adjacent first and second silicon atoms in the interface region,
wherein the $ND_2^+$ in the interface region comprises second and third deuterium atoms that are bonded to a nitrogen atom that is bonded to adjacent third and fourth silicon atoms in the interface region, and
wherein the first metal layer includes titanium nitride (TiN).

4. The method of claim 1, further comprising:
forming a second metal layer on the first metal layer; and
forming a gate capping layer on the first metal layer and the second metal layer.

5. The method of claim 4, further comprising:
forming first and second impurity regions in an upper portion of the active region;
forming a bit line contact electrically connected to the second impurity region;
forming a bit line electrically connected to the bit line contact;
forming a storage node contact electrically connected to the first impurity region; and
forming a data storage element electrically connected to the storage node contact.

6. The method of claim 1, wherein the annealing process is performed at a temperature in a range of about 650° C. to about 750° C.

7. The method of claim 1, wherein the preliminary metal layer is formed by using $TiCl_4$ and $ND_3$ as precursors and depositing a titanium nitride (TiN) layer, while removing byproducts $N_2$ and DCl.

8. The method of claim 1, wherein the $D^+$ is diffused by rapid thermal nitridation from the first metal layer to be distributed in an interface region of the gate dielectric layer adjacent to the first metal layer.

9. The method of claim 1, wherein the $ND_2^+$ is diffused by rapid thermal nitridation from the first metal layer to be distributed in an interface region of the gate dielectric layer adjacent to the first metal layer.

10. The method of claim 1, further comprising forming a second metal layer on the first metal layer, wherein the annealing process is performed before forming the second metal layer.

11. The method of claim 1, wherein the first metal layer comprises D and $ND_2$.

12. A method of manufacturing a semiconductor device, the method comprising:
forming an active region extending in a direction parallel to an upper surface of a substrate; and
forming a gate structure on the substrate and intersecting the active region,
wherein the forming the gate structure comprises:
forming a gate dielectric layer on the active region;
forming a first metal layer on the gate dielectric layer;
forming a second metal layer on the first metal layer; and
forming a gate capping layer on the first metal layer and the second metal layer,
wherein the gate dielectric layer includes $D^+$ and $ND_2^+$ diffused by rapid thermal nitridation from the first metal layer to be distributed in an interface region of the gate dielectric layer adjacent to the first metal layer,
wherein the rapid thermal nitridation includes an annealing process,
wherein D is deuterium, N is nitrogen, and $D^+$ is positively-charged deuterium, and
wherein a concentration of the $D^+$ in the gate dielectric layer is greater than a concentration of the $ND_2^+$ in the gate dielectric layer.

13. The method of claim 12, wherein the rapid thermal nitridation includes distributing the $D^+$ and the $ND_2^+$ diffused from the first metal layer into the gate dielectric layer.

14. The method of claim 12, wherein the concentration of the $D^+$ increases from a first interface between the active region and the gate dielectric layer to a second interface between the gate dielectric layer and the first metal layer.

15. The method of claim 12, wherein the concentration of the $ND_2^+$ increases from a first interface between the active region and the gate dielectric layer to a second interface between the gate dielectric layer and the first metal layer.

16. The method of claim 12, wherein the annealing process is performed in an atmosphere containing $ND_3$ gas.

17. A method of manufacturing a semiconductor device, the method comprising:
forming an isolation layer in a first trench in a substrate, the isolation layer defining an active region of the substrate;
forming a gate structure in a second trench intersecting the active region;
wherein the forming the gate structure comprises:
forming a gate dielectric layer in the second trench and including silicon oxide;
forming a first metal layer on the gate dielectric layer and including metal nitride;
forming a second metal layer on the first metal layer; and
forming a gate capping layer on the first metal layer and the second metal layer,
wherein the gate dielectric layer has first and second defects and includes $D^+$ and $ND_2^+$ trapped in the first and second defects, respectively, wherein the $D^+$ and the $ND_2^+$ are distributed into the gate dielectric layer in an annealing process, wherein D is deuterium, N is nitrogen, and $D^+$ is positively-charged deuterium, and wherein a concentration of the $D^+$ in the gate dielectric layer is greater than a concentration of the $ND_2^+$ in the gate dielectric layer.

18. The method of claim 17, wherein the first and second defects are first and second oxygen vacancies, respectively.

19. The method of claim 17, wherein the $D^+$ and the $ND_2^+$ are adjacent an interface between the gate dielectric layer and the first metal layer, and wherein the annealing process is performed before forming the second metal layer and includes distributing the $D^+$ and the $ND_2^+$ diffused from the first metal layer into the gate dielectric layer.

20. The method claim 18, wherein the first and second oxygen vacancies are adjacent an interface between the gate dielectric layer and the first metal layer.

\* \* \* \* \*